(12) United States Patent
Lee et al.

(10) Patent No.: US 10,818,868 B2
(45) Date of Patent: Oct. 27, 2020

(54) OLED PANEL FOR LIGHTING DEVICE AND METHOD OF MANUFACTURING THE SAME

(71) Applicant: LG DISPLAY CO., LTD., Seoul (KR)

(72) Inventors: Jungeun Lee, Seoul (KR); Chulho Kim, Paju-si (KR); Taejoon Song, Paju-si (KR); Kyu-Hwang Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 67 days.

(21) Appl. No.: 16/201,383

(22) Filed: Nov. 27, 2018

(65) Prior Publication Data

US 2019/0165306 A1 May 30, 2019

(30) Foreign Application Priority Data

Nov. 29, 2017 (KR) .......................... 10-2017-0162297

(51) Int. Cl.
*H01L 51/52* (2006.01)
*H01L 51/00* (2006.01)
*H01L 51/56* (2006.01)

(52) U.S. Cl.
CPC ...... *H01L 51/5228* (2013.01); *H01L 51/0097* (2013.01); *H01L 51/5212* (2013.01); *H01L 51/56* (2013.01); *H01L 51/5203* (2013.01); *H01L 51/5237* (2013.01); *H01L 51/5253* (2013.01); *H01L 2251/5338* (2013.01); *H01L 2251/5361* (2013.01); *H01L 2251/5392* (2013.01)

(58) Field of Classification Search
CPC ....................................................... H01L 51/52
See application file for complete search history.

(56) References Cited

U.S. PATENT DOCUMENTS

2019/0165086 A1* 5/2019 Kim ..................... H01L 51/5221
2019/0172891 A1* 6/2019 Lee ..................... H01L 51/5206

\* cited by examiner

*Primary Examiner* — Marvin Payen
(74) *Attorney, Agent, or Firm* — Seed IP Law Group LLP

(57) ABSTRACT

An OLED panel for a lighting device is provided. The OLED panel for a lighting device may include a substrate; a first auxiliary wiring pattern disposed on the substrate; a first electrode disposed on a substrate on which the first auxiliary wiring pattern is disposed; a passivation layer disposed on the first electrode within an area where the first auxiliary wiring pattern is disposed; a second auxiliary wiring pattern disposed on the passivation layer to form a plurality of areas partitioned from each other; an OLED light emitting structure disposed in the plurality of areas partitioned by the second auxiliary wiring pattern; a second electrode disposed on the OLED light emitting structure and the second auxiliary wiring pattern; and, an encapsulating layer disposed on the second electrode. The OLED panel for a lighting device may form the respective OLED light emitting structures in an island shape, thereby improving luminance uniformity.

11 Claims, 4 Drawing Sheets

OLED PANEL FOR LIGHTING DEVICE AND METHOD OF MANUFACTURING THE SAME

CROSS-REFERENCE TO RELATED APPLICATION

This application claims priority under 35 U.S.C. § 119 to Korean Application No. 10-2017-0162297, filed on Nov. 29, 2017, whose entire disclosure is herein incorporated by reference.

BACKGROUND

Technical Field

The present disclosure relates to an OLED panel for a lighting device, more particularly, an OLED panel for a lighting device capable of improving luminance uniformity. Further, the present disclosure relates to a method of manufacturing an OLED panel for a lighting device capable of improving luminance uniformity.

Description of the Related Art

Currently, a fluorescent lamp or an incandescent lamp is mainly used as a current lighting device. In the case of the incandescent lamp, a color rendering index is high, but energy efficiency is very low. Conversely, in the case of the fluorescent lamp, the energy efficiency is high, but the color rendering index is low. Further, the fluorescent lamp contains mercury, which causes environmental problems.

Recently, a light emitting diode (LED) based lighting device has been proposed. The LED, which has a laminated structure of a nitride semiconductor, such as GaN, has the highest light emission efficiency at a blue wavelength band and decreasing light emission efficiency toward a red wavelength band and a green wavelength band which has the highest luminosity. Thus, when the lighting device emits white light output by a combination of a red LED, a green LED and a blue LED, the light emission efficiency is lowered. Also, when using the red, green, and blue LEDs, each emission peak has a narrow width, so that a color rendering property deteriorates.

In order to solve these problems, a lighting device to output white light by combining the blue LED and a yellow phosphor instead of combining the red, green and blue LEDs has been proposed, because it is more efficient to use the blue LED having a higher light emission efficiency than the green LED, and for the other colors to use a fluorescent material that receives blue light to emit yellow light.

However, even though the lighting device outputs white light by combining the blue LED and a phosphor having yellow color, the fluorescent material itself emitting yellow light has poor light emission efficiency, and thus there is a limitation in improving the light emission efficiency of the lighting device.

In particular, a nitride semiconductor LED based lighting device has a limitation that a heat dissipating means should be disposed on a rear surface of the light device due to a large amount of heat generated by the LED, and a high-priced sapphire should be used for growth of a high quality nitride semiconductor.

Further, in order to manufacture the LED based lighting device, many processes, such as an epi process for growing a nitride semiconductor, a chip process for manufacturing an individual LED chip, and a mounting process for mounting the individual LED chips on a circuit board, are typically performed.

BRIEF SUMMARY

Embodiments disclosed herein provide an OLED (organic light emitting diode) panel for a lighting device.

Embodiments disclosed herein also provide a method of manufacturing the OLED panel for a lighting device.

According to an embodiment of the present disclosure, an OLED panel for a lighting device may include a substrate; a first auxiliary wiring pattern; a first electrode; a passivation layer; a second auxiliary wiring pattern; an OLED light emitting structure; a second electrode; and an encapsulating layer. The first auxiliary wiring pattern may be disposed on the substrate. The first auxiliary wiring pattern may include a plurality of auxiliary wirings electrically connected to each other. The first electrode may be disposed on the substrate on which the first auxiliary wiring pattern is disposed. The passivation layer may be disposed on the first electrode, at least within an area where the first auxiliary wiring pattern is disposed. The second auxiliary wiring pattern may be disposed on the passivation layer to form a plurality of areas partitioned from each other. The second auxiliary wiring pattern may include a plurality of auxiliary wirings electrically connected to each other. The OLED light emitting structure may be disposed in the plurality of areas partitioned by the second auxiliary wiring pattern. The second electrode may be disposed on the OLED light emitting structure and the second auxiliary wiring pattern. The encapsulating layer may be disposed on the second electrode.

By the aforementioned configuration, the OLED light emitting structure may be disposed in an island shape in the plurality of areas partitioned by the second auxiliary wiring pattern. Thus, it is possible to prevent a decrease in luminance uniformity even when a large-area OLED panel is manufactured.

Here, the second auxiliary wiring pattern may have a reverse taper-shaped cross-section whose width is gradually wider toward an upper portion thereof. In this case, the OLED light emitting structure may be disposed and contained within the plurality of areas partitioned by the second auxiliary wiring pattern, and may not be disposed on an inclined surface of the second auxiliary wiring pattern, so that it is possible to prevent a decrease in light emission efficiency of the OLED light emitting structure even when a separate process is not performed.

In addition, the first auxiliary wiring pattern may have a taper-shaped cross-section whose width is gradually narrower toward an upper portion thereof. Thus, it is possible to stably dispose the first electrode on the first auxiliary wiring pattern.

Further, the first electrode may be provided with an opening through which the substrate is exposed, and the opening may be further provided with the passivation layer. Thus, it is possible to prevent the occurrence of a short circuit between the first electrode and the second electrode due to the permeation of moisture or air.

Preferably, the opening may be disposed in the plurality of areas partitioned by the second auxiliary wiring pattern. In this case, it is possible to further lower the possibility that moisture or air permeates into the OLED light emitting structure.

According to another embodiment of the present disclosure, a method of manufacturing an OLED panel for a lighting device may include:

disposing a first auxiliary wiring pattern on a substrate;

disposing a first electrode on the substrate on which the first auxiliary wiring pattern is disposed;

disposing a passivation layer on the first electrode, at least within an area where the first auxiliary wiring pattern is disposed; disposing a second auxiliary wiring pattern on the passivation layer to form a plurality of areas partitioned from each other; disposing an OLED light emitting structure in the plurality of areas partitioned by the second auxiliary wiring pattern; disposing a second electrode on the OLED light emitting structure and the second auxiliary wiring pattern; and disposing an encapsulating layer on the second electrode.

Here, the second auxiliary wiring pattern may be used as a mask the OLED light emitting structure disposition step. That is, even when a separate mask for forming the OLED light emitting structure to in an island shape is not used, the second auxiliary wiring pattern itself may serve as a mask such that the OLED light emitting structure may be formed to in an island shape. Thus, it is possible to prevent a decrease in luminance uniformity of a large-area OLED panel.

Preferably, the second auxiliary wiring pattern may have a reverse taper-shaped cross-section whose width is gradually wider toward the upper portion thereof. In this case, the OLED light emitting structure may be disposed and contained within the plurality of areas partitioned by the second auxiliary wiring pattern, and may not be disposed on an inclined surface of the second auxiliary wiring pattern. Thus, it is possible to prevent a decrease in light emission efficiency even when a separate process is not performed.

Further, the first electrode may be provided with an opening through which the substrate is exposed before the passivation layer forming step, and the opening may be further provided with the passivation layer in the passivation layer forming step. Here, the opening may be disposed in the plurality of areas partitioned by the second auxiliary wiring pattern.

According to the embodiment of the present disclosure, the OLED panel for a light device may be easily manufactured to have a large-area, and thereby it is possible to emit light through a light emitting surface; may not require a high-priced sapphire for forming a nitride semiconductor LED; and may have a better heat generating performance than the nitride semiconductor LED.

In particular, the OLED panel for a lighting device may form the OLED light emitting structure in an island shape by means of the second auxiliary wiring pattern, without a separate mask, and thereby it is possible to prevent a decrease in the luminous uniformity of the large-area OLED panel.

Also, the OLED panel for a lighting device may include the first auxiliary wiring pattern formed of a metal material along with the first electrode, and the second auxiliary wiring pattern formed of a metal material along with the second electrode. Through the first and second wiring patterns, it is possible to compensate resistances of the first and second electrodes to improve a current dispersion effect, thereby improving the luminance uniformity.

DETAILED DESCRIPTION

Hereinafter, an organic light emitting diode (OLED) panel for a light device and a method for the same according to embodiments of the present disclosure will be described with reference to the accompanying drawings.

Terms such as first, second, etc., may be used herein to describe components. Such terms are not used to define a corresponding component, but are used merely to distinguish the corresponding component from another component.

In describing a positional relationship using phrases such as "component A on component B" and "component A above component B," another component C may be arranged between the components A and B unless the term "immediately" or "directly" is explicitly used.

Figure 1:
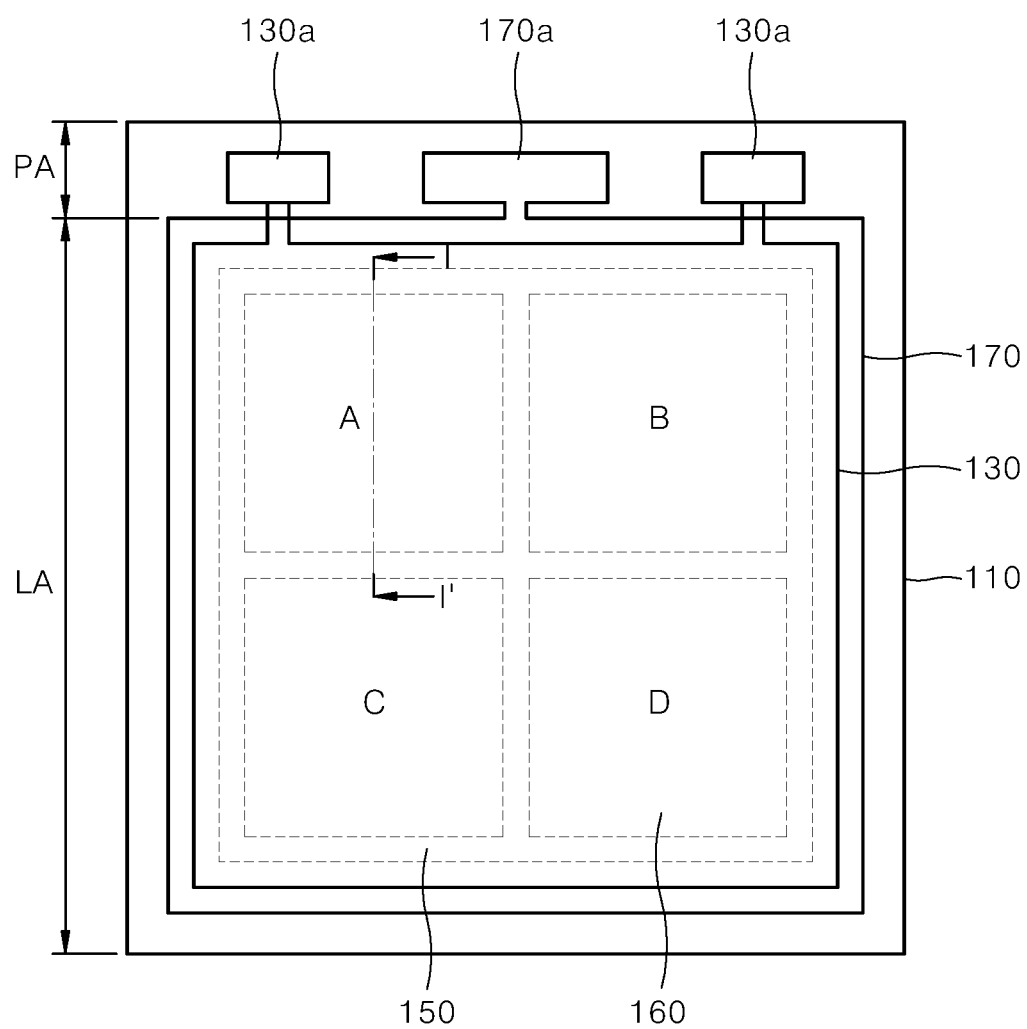
FIG. 1 is a schematic plan view of an OLED panel for a lighting device according to an embodiment.

FIG. 1 is a schematic plan view of an OLED panel for a lighting device according to an embodiment. Also, FIG. 2 is a cross-sectional view taken along I-I' line of FIG. 1 when a second auxiliary wiring pattern is not disposed according to an embodiment, and FIG. 3 is a cross-sectional view taken along I-I' line of FIG. 1 when a second auxiliary wiring pattern is disposed according to an embodiment.

Figure 2:
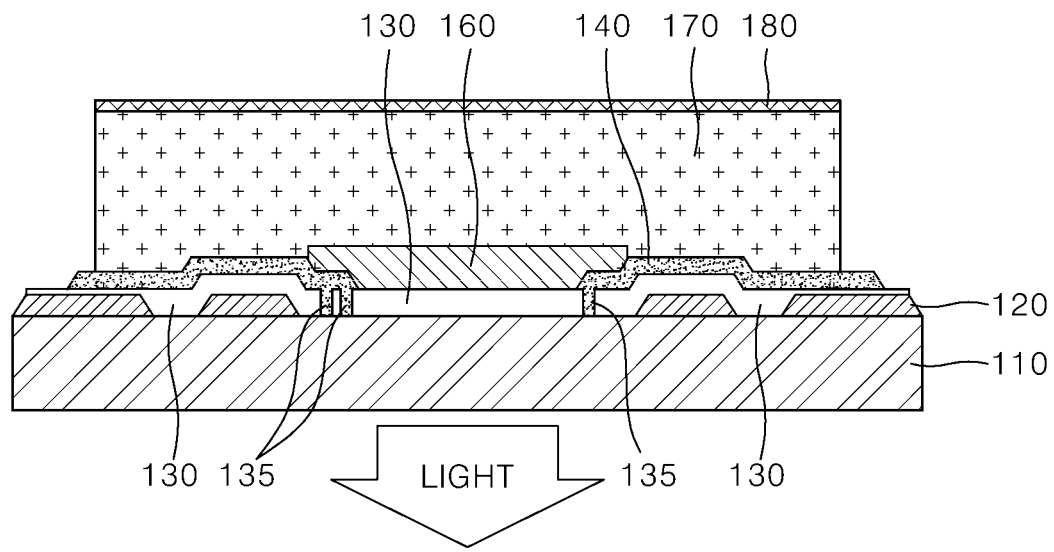
FIG. 2 is a cross-sectional view taken along I-I' line of FIG. 1 when a second auxiliary wiring pattern is not disposed according to an embodiment.
Figure 3:
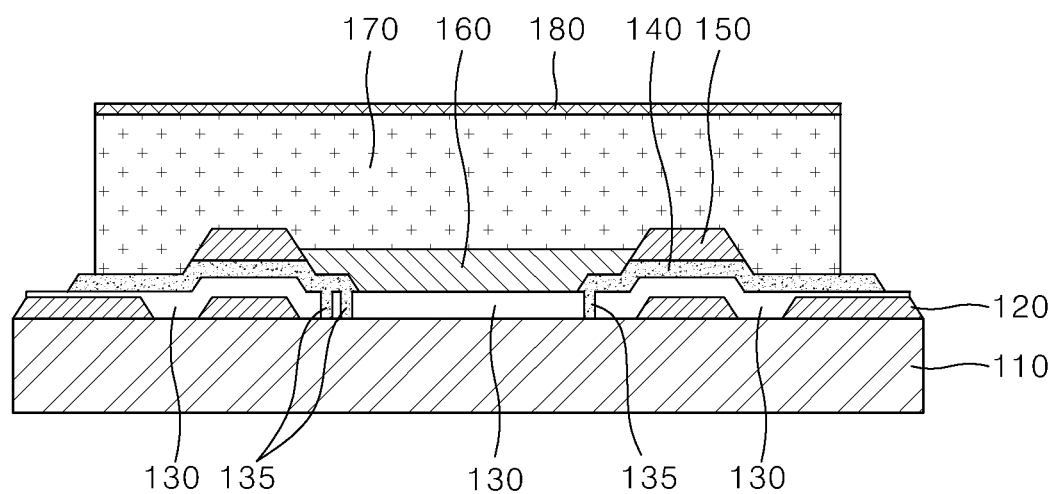
FIG. 3 is a cross-sectional view taken along I-I' line of FIG. 1 when a second auxiliary wiring pattern is disposed according to an embodiment.

Referring to FIGS. 1 to 3, the OLED panel for a lighting device of the present disclosure may include a substrate 110, a first auxiliary wiring pattern 120, a first electrode 130, a passivation layer 140, a second auxiliary wiring pattern 150, an OLED light emitting structure 160, a second electrode 170, and an encapsulating layer 180.

The substrate 110 may be a glass substrate or a polymer substrate. When the polymer substrate is used as the substrate 110, the OLED panel for a lighting device may be manufactured by, for example, a roll-to-roll process since the polymer substrate is flexible.

The first auxiliary wiring pattern 120 may be disposed on the substrate 110. The first auxiliary wiring pattern 120 is a metal or wiring layer. The first auxiliary wiring pattern 120 may include a plurality of auxiliary wirings electrically connected to each other.

The role of the first auxiliary wiring pattern 120 is as follows. The first electrode 130 may be formed of a transparent conductive oxide (TCO) material, such as indium tin oxide (ITO), fluorine-doped tin oxide (FTO), etc. The TCO material may penetrate light emitted from the OLED light emitting structure 150, but may have higher electric resistance than a metal material. Therefore, when manufacturing an OLED panel for a large-area lighting device, an applied voltage may be unevenly distributed over the entire first electrode due to the high resistance of the TCO material. Such uneven voltage distribution lowers the luminance uniformity of the large-area lighting device.

Hence, the first auxiliary wiring pattern 120 may be formed of a material having lower resistance than the TCO material, such as a material including metal, and thereby, the first auxiliary wiring pattern 120 may serve to evenly distribute the voltage applied to the first electrode 130 in contact with the first auxiliary wiring pattern 120 over the entire first electrode 130.

In addition, the first auxiliary wiring pattern 120 may be formed in a net shape, but is not limited thereto. Further, the auxiliary wiring pattern 120 may be substantially symmetrical vertically, but is not limited thereto.

The first auxiliary wiring pattern 120 may have a taper-shaped cross-section whose width is gradually narrower toward an upper portion thereof. Thus, it is possible to stably dispose the first electrode 130 on the first auxiliary wiring pattern 120.

The first electrode 130 may be disposed on the substrate 110 on which the first auxiliary wiring pattern 120 is disposed, and may be connected to a first electrode pad 130a. The first electrode 130 may be formed of a TCO material, such as ITO, and may be formed, for example, through a sputtering process or a coating process.

The passivation layer 140 may be disposed on the first electrode 130, at least within an area where the first auxiliary wiring pattern 120 is disposed. When a short circuit between the first electrode 130 and the second electrode 170 occurs in the OLED lighting device, the luminance of the entire panel as well as the portion where the short circuit occurs may be lowered due to a current drop. In order to prevent the luminance from being lowered, the passivation layer 140 may be formed on respective upper portions of the auxiliary wirings of the first auxiliary wiring pattern 120. However, the light emitting area may be reduced by as much as the first auxiliary wiring pattern 120 is wide. Thus, it is preferable to dispose the passivation layer 140 with a minimum area in the plurality of areas A to D partitioned by the second auxiliary wiring pattern 150.

The passivation layer 140 may be formed of an organic material, such as a polyimide based material, or an inorganic material, such as alumina ($Al_2O_3$), silicon nitride (SiNx), etc. More specifically, a passivation material may be an organic material, such as polyimide, etc., or an inorganic material, such as alumina ($Al_2O_3$), silicon nitride (SiNx), etc. The deposition of the passivation material may be performed by, for example, an atomic layer deposition (ALD) method, a chemical vapor deposition (CVD) method, etc. For example, when applying an atmospheric pressure ALD method, $Al_2O_3$ may be deposited by the ALD deposition method, using a trimethyl-aluminum (TMA) as a precursor. In addition, $Al_2O_3$, $ZrO_2$, $HfO_2$, $TiO_2$, etc., also may be deposited by the atmospheric pressure ALD method, using $Zr(NMe_2)_4$, $HfCl_4$, or $TiCl_4$ as a precursor.

The second auxiliary wiring pattern 150 may be disposed on the passivation layer 140 to form a plurality of areas (A to D of FIG. 1) partitioned from each other. The second auxiliary wiring pattern 150 is a metal or wiring layer. The second auxiliary wiring pattern 150 may include a plurality of auxiliary wirings electrically connected to each other.

The second auxiliary wiring pattern 150 may have a taper-shaped cross-section whose width is gradually narrower toward an upper portion thereof, as shown in FIG. 3. But, in this case, the OLED light emitting structure 160 may be disposed on an inclined surface (i.e., a side surface as shown in FIG. 3) of the second auxiliary wiring pattern 150. In this case, for example, a direct conduction between an electron transporting layer and a hole transporting layer of an OLED may occur, and as a result, the light emission efficiency may be lowered. Therefore, a separate removal step will likely have to be used.

Figure 4:
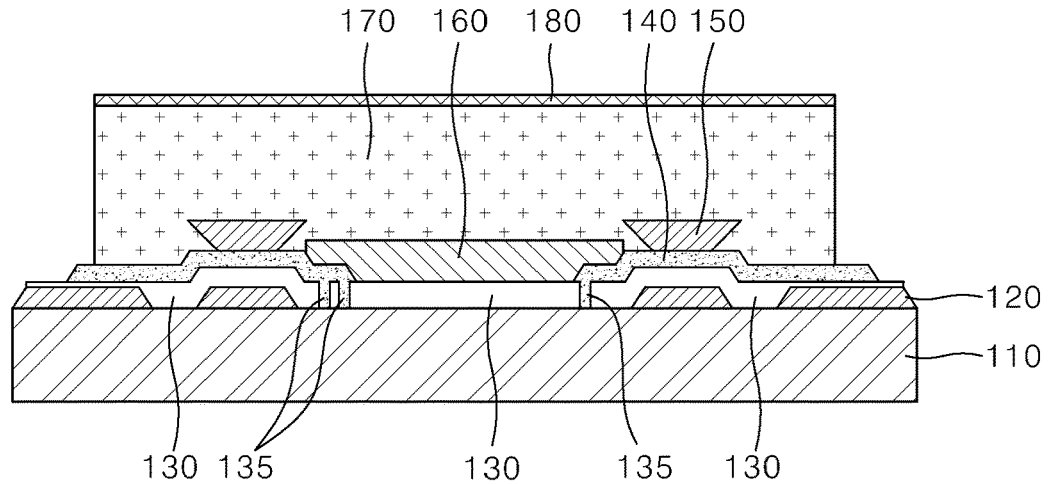
FIG. 4 shows an example in which a second auxiliary wiring pattern is disposed in a reverse taper-shape according to an embodiment.

Hence, the second auxiliary wiring pattern 150 may preferably have a reverse taper-shaped cross-section whose width is gradually wider toward the upper portion thereof, as shown, for example, in FIG. 4. When the second auxiliary wiring pattern 150 has a reverse taper-shaped cross-section, the OLED light emitting structure 160 may be disposed and contained within the plurality of areas partitioned by the second auxiliary wiring pattern 150, and may not be disposed on the inclined surface of the second auxiliary wiring pattern 150, so that it is possible to prevent a decrease in the light emission efficiency of the OLED light emitting structure 160 even when a separate process is not performed.

The OLED light emitting structure 160 may be disposed in the plurality of areas A to D partitioned by the second auxiliary wiring patterns 150. The OLED light emitting structure 160 may include an emission layer (EML); a hole injection layer (HIL) and/or a hole transport layer (HTL) to provide a hole to the emission layer; and an electron transport layer (ETL) and/or an electron injection layer (EIL) to provide an electron to the emission layer.

The second electrode 170 may be disposed on the OLED light emitting structure 160 and the second auxiliary wiring pattern 150, and may be connected to a second electrode pad 170a. Further, the second electrode 170 may be formed of a TCO material such as, for example, ITO.

The encapsulating layer 180 may be disposed on the second electrode 170, and may prevent water or air from being permeated from the outside. Such an encapsulating layer 180 may be formed of an organic material, such as an acrylate based compound and an epoxy based compound, an inorganic material, such as ceramics and metal, or an organic-inorganic composite material. Further, the encapsulating layer 180 may have a single-layer structure or a multi-layer structure.

FIG. 4 shows an example in which the encapsulating layer 180 is formed on the upper portion of the second electrode 170. However, in order to enhance the effect of preventing moisture, etc., from permeating, the encapsulating layer 180 may also be formed at sides of the respective components 120 to 160 formed in the LA.

A protective film may be further disposed on the encapsulating layer 180 through an adhesive layer. The protective film also may prevent moisture or air from permeating from the outside. The protective film may be a PET substrate, a metal foil, etc.

By the configuration in which the OLED panel for a lighting device may include the second auxiliary wiring pattern 150 as described above, the OLED light emitting structure may be disposed in an island shape in the plurality of areas partitioned by the second auxiliary wiring pattern. As a result, it is possible to prevent a decrease in the luminance uniformity even when, for example, an OLED panel having a large area of 4 inches or more is manufactured.

Referring to FIGS. 3 and 4, the first electrode 130 may be provided with an opening 135 through which the substrate 110 is exposed, and the opening 135 may be further provided with the passivation layer 140. Thus, it is possible to prevent the occurrence of a short circuit between the first electrode 130 and the second electrode 170 due to the permeation of moisture or air.

Preferably, the openings 135 may be disposed in the plurality of areas partitioned by the second auxiliary wiring pattern 150, as shown in FIGS. 3 and 4. In this case, it is possible to further lower the possibility that moisture or air permeate into the OLED light emitting structure 160, and as a result, it is advantageous for improving the light emission efficiency and lifespan property.

Figure 5:
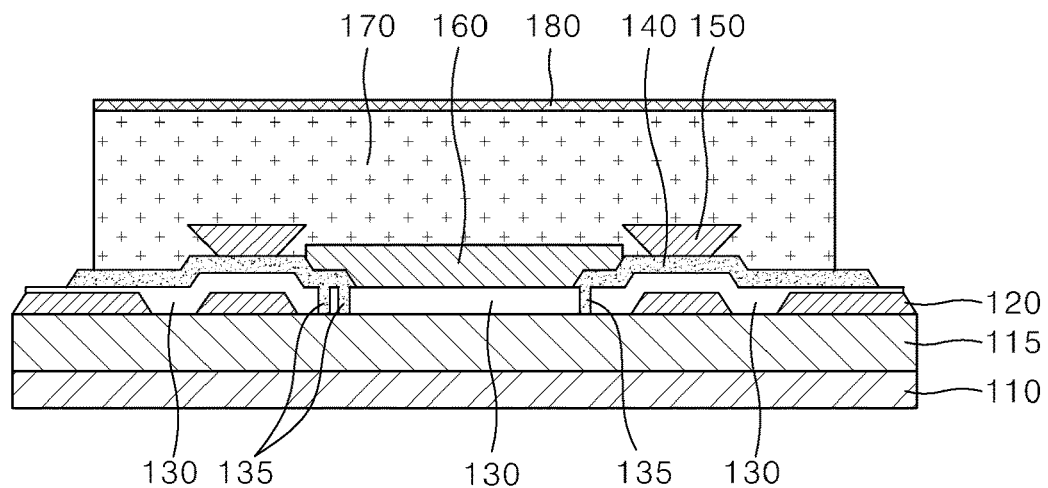
FIG. 5 shows an example in which a flexible substrate is applied according to an embodiment.

FIG. 5 shows an example in which a flexible substrate is applied according to an embodiment.

The OLED panel for a lighting device may use a glass substrate or a polymer substrate having an excellent flexible property as the substrate 110. When the polymer substrate is used, the first auxiliary wiring pattern forming step and the subsequent steps may be performed after forming a single or multi-layered buffer layer 115 as shown in FIG. 5.

In the meantime, the first electrode pad 130a and the second electrode pad 170a will be described as follows.

The first electrode pad 130a may be connected to the first electrode 130. The second electrode pad 170a may be connected to the second electrode 170. In FIG. 1, the second electrode pad 170a may disposed at a central portion of a pad area (PA), and the first electrode pads 130a may be respectively disposed at opposite sides of the second electrode pad 170a. However, the disposition, the shape, the size, and the number, etc., of the electrode pads may be changed, as needed.

The first electrode pad 130a may include a lower layer having the same material as the first auxiliary wiring pattern 120 and an upper layer having the same material as the first electrode 130. The lower layer 131 may be formed simultaneously with the first auxiliary wiring pattern 120 and be directly connected to the first auxiliary wiring pattern 120. The upper layer may be formed simultaneously with the first electrode 130. When the lower layer is directly connected to the first auxiliary wiring pattern 120, the upper layer may not be directly connected to the first electrode 130.

Also, the second electrode pad 170a may include a lower layer having the same material as the first auxiliary wiring pattern 120 and an upper layer having the same material as the second electrode 170. The lower layer may be formed simultaneously with the first auxiliary wiring pattern 120 and the upper layer may be formed simultaneously with the second electrode 170.

Hereinafter, a method of manufacturing an OLED for a lighting device according to embodiments of the present disclosure will be described with reference to FIGS. 6A to 6C.

Figure 6A:
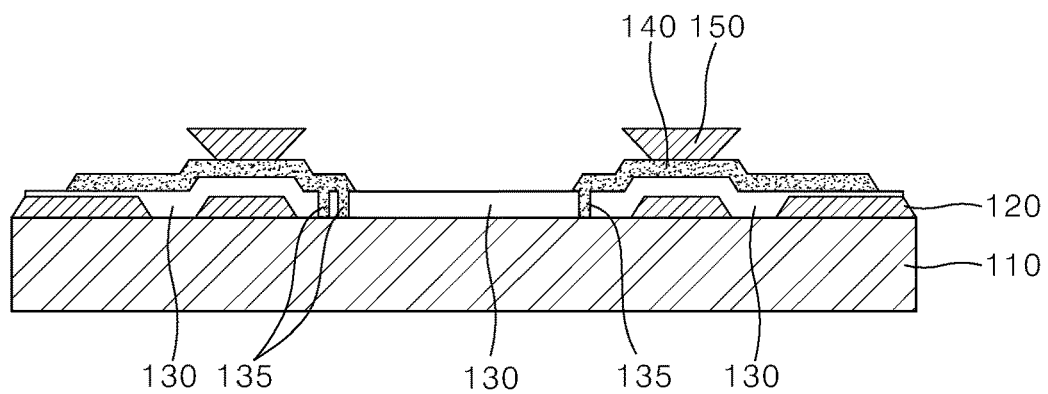
FIGS. 6A to 6C show a method of manufacturing an OLED panel for a lighting device according to an embodiment.

First, as shown in FIG. 6A, the first auxiliary wiring pattern 120, the first electrode 130, the passivation layer 140, and the second auxiliary wiring pattern 150 may be formed on the substrate 110 in a consecutive order.

More specifically, the first auxiliary wiring pattern 120 may be disposed on the substrate 110. Thereafter, the first electrode 130 may be disposed on the substrate 110 on which the first auxiliary wiring pattern 120 is disposed. The first electrode 130 may be formed of a transparent conductive oxide (TCO) material, such as ITO. The first electrode 130 may be formed in the entire LA, and in a part of the PA to form the first electrode pad 130a. That is, the upper layer of the first electrode pad 130a having the same material as the first electrode may be formed in the first electrode disposition step.

Thereafter, the passivation layer 140 may be disposed on the first electrode 130, at least within an area where the first auxiliary wiring pattern 120 is disposed.

In addition, as shown in FIGS. 3 and 4, the opening 135 may be formed to expose the substrate 110 to the first electrode 130 before the passivation layer 140 is formed. In this case, the opening 135 may be further provided with the passivation layer 140 in the passivation layer forming step.

Also, the opening 135 may be formed in the plurality of areas partitioned by the second auxiliary wiring patterns 150.

Thereafter, the second auxiliary wiring pattern 150 is disposed on the passivation layer 140 to form the plurality of areas partitioned from each other. As described above, the second auxiliary wiring pattern 150 may be formed to have a reverse tapered cross-section whose width is gradually wider toward the upper portion thereof. In this case, the OLED light emitting structure may be disposed and contained within the plurality of regions partitioned by the second auxiliary wiring pattern, and may not be disposed on the inclined surface of the second auxiliary wiring pattern, so that it is possible to prevent a decrease in the light emission efficiency of the OLED light emitting structure even when a separate process is not performed.

Figure 6B:
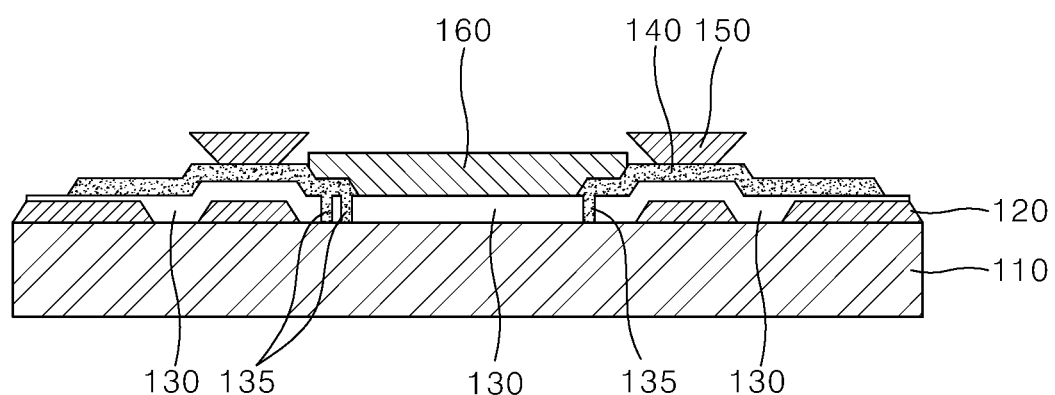

Next, as shown in FIG. 6B, the OLED light emitting structure 160 may be disposed in the plurality of areas A to D partitioned by the second auxiliary wiring patterns 150.

Each layer of the OLED light-emitting structure 160 may be formed by depositing an organic material, such as copper phthalocyanine (CuPc), N,N-Di(naphthalen-1-yl)-N, N'-diphenylbenzidine: NPB) and tris-8-hydroxyquinoline aluminum (Alq3) through a vacuum deposition method.

Here, the second auxiliary wiring pattern 150 may be used as a mask in the OLED light emitting structure 160 disposition step. That is, even when a separate mask for forming the OLED light emitting structure in an island shape is not used, the second auxiliary wiring pattern itself may serve as a mask such that the OLED light emitting structure may be formed in an island shape. Thus, it is possible to prevent a decrease in the luminance uniformity of the large-area OLED panel.

Figure 6C:
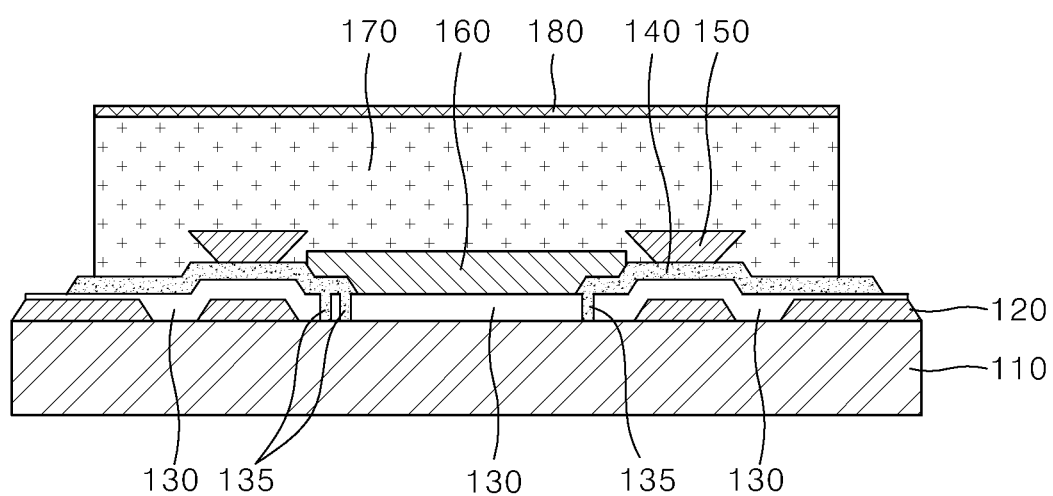

Next, as shown in FIG. 6C, the second electrode 170 may be disposed on the OLED light emitting structure 160 and the second auxiliary wiring pattern 150. Subsequently, the encapsulating layer 180 may be disposed on the second electrode 170.

As described above, The OLED panel for a lighting device may form the OLED light emitting structure in an island shape by means of the second auxiliary wiring pattern without a separate mask, and thereby it is possible to prevent a decrease in the luminance uniformity of the large-area OLED panel.

Also, the OLED panel for a lighting device may include the first auxiliary wiring pattern formed of a metal material along with the first electrode, and the second auxiliary wiring pattern formed of a metal material along with the second electrode. Through the first and second wiring patterns, it is possible to compensate resistances of the first and second electrodes to improve a current dispersion effect, thereby improving the luminance uniformity.

Next, the OLED light emitting structure 160 may be disposed in a light emitting area (LA), as shown, for example in FIG. 1.

Next, as shown in FIG. 6C, the second electrode 170 may be disposed on the OLED light emitting structure 160. The second electrode 170 may be formed of a metal material or a TCO material.

The second electrode 170 may be formed in the entire LA and may be formed in a part of the PA to form a second electrode pad 170a. In the second electrode disposition step, the upper layer of the second electrode pad 170a having the same material as the second electrode may be formed.

After the second electrode 170 is formed, an aging voltage may be applied to an organic layer to further perform a process of aging the OLED light emitting structure 160. An organic light emitting material may have a short lifespan and be vulnerable to moisture or oxygen. For this reason, the device formed of the organic light emitting material may be damaged when a high voltage or a high current is applied thereto. Further, since an interfacial property between the first and second electrodes 130 and 170 and the OLED light emitting structure 160 are poor, the device may have unstable properties. Furthermore, when the second electrode 170 is formed, impurities may be laminated in the OLED light emitting structure 160 to lower the light emission property and color of the organic material.

In order to solve these problems, it is possible to age the OLED light emitting structure 160 in a short time by applying a high aging voltage to the OLED light emitting structure 160. Here, the aging voltage may be higher than the voltage applied to the first electrode 130 and the second electrode 170, and may be the reverse voltage of the voltage applied to the first electrode 130 and the second electrode 170.

Through the above-described processes, the OLED panel for a lighting device may be manufactured. A publicly known process may be further included in addition to the processes.

The present disclosure is described with reference to embodiments described herein and accompanying drawings, but is not limited thereto. It should be apparent to those skilled in the art that various changes or modifications which are not exemplified herein but are still within the spirit and scope of the present disclosure may be made.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting diode (OLED) panel, comprising:
   a substrate;
   a first auxiliary wiring pattern disposed on the substrate;
   a first electrode disposed on the substrate;
   a passivation layer disposed on the first electrode and the first auxiliary wiring pattern;
   a second auxiliary wiring pattern disposed on the passivation layer to form a plurality of areas partitioned from each other;
   an OLED light emitting structure disposed in the plurality of areas partitioned by the second auxiliary wiring pattern;
   a second electrode disposed on the OLED light emitting structure and the second auxiliary wiring pattern; and
   an encapsulating layer disposed on the second electrode.

2. The OLED panel of claim 1, wherein
   the second auxiliary wiring pattern has a reverse taper-shaped cross-section whose width is gradually wider toward a portion thereof that is furthest away from the substrate.

3. The OLED panel of claim 1, wherein
   the first auxiliary wiring pattern has a taper-shaped cross-section whose width is gradually narrower toward a portion thereof that is furthest away from the substrate.

4. The OLED panel of claim 1, wherein
   the first electrode includes an opening through which the substrate is exposed, and
   the passivation layer is in the opening.

5. The OLED panel of claim 4, wherein
   the opening is disposed in the plurality of areas partitioned by the second auxiliary wiring pattern.

6. A device, comprising:
   a substrate;
   a first wiring layer on the substrate;
   a first electrode on the substrate and the first wiring layer;
   a passivation layer on the first electrode;
   a second wiring layer on the passivation layer;
   an organic light emitting diode (OLED) light emitting structure on the first electrode; and
   a second electrode on the passivation layer, the second wiring layer, and the OLED light emitting structure.

7. The device of claim 6 wherein the second wiring layer includes a first component and a second component, and the OLED light emitting structure is positioned between the first component and the second component.

8. The device of claim 7 wherein each of the first and second components includes a first portion and a second portion that is spaced from the substrate by the first portion, the first portion has a first width, and the second portion has a second width that is different from the first width.

9. The device of claim 6 wherein the OLED light emitting structure is spaced from the second wiring layer by the second electrode.

10. The device of claim 6, further comprising:
    a buffer layer between the substrate and the first wiring layer.

11. The device of claim 6, further comprising:
    an encapsulating layer on the second electrode.

* * * * *